US007800180B2

(12) United States Patent
Watanabe et al.

(10) Patent No.: US 7,800,180 B2
(45) Date of Patent: Sep. 21, 2010

(54) SEMICONDUCTOR ELECTROSTATIC PROTECTION DEVICE

(75) Inventors: Atsushi Watanabe, Kanagawa (JP); Yasuhisa Ishikawa, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 124 days.

(21) Appl. No.: 11/757,448

(22) Filed: Jun. 4, 2007

(65) Prior Publication Data
US 2008/0001229 A1    Jan. 3, 2008

(30) Foreign Application Priority Data
Jun. 29, 2006    (JP)    ............... 2006-180227

(51) Int. Cl.
H01L 23/62    (2006.01)
(52) U.S. Cl. .................... 257/360; 257/173
(58) Field of Classification Search ............ 257/175, 257/173, 361, 362, 355, 360
See application file for complete search history.

(56) References Cited

U.S. PATENT DOCUMENTS

| | | | | |
|---|---|---|---|---|
| 3,798,510 A | * | 3/1974 | Erickson et al. ............. | 257/724 |
| 3,934,209 A | * | 1/1976 | Valentine et al. ............ | 330/295 |
| 4,145,638 A | * | 3/1979 | Kaneda ....................... | 315/323 |
| 4,342,967 A | * | 8/1982 | Regan et al. ................. | 330/277 |
| 4,535,303 A | * | 8/1985 | Schoofs et al. .............. | 330/297 |
| 5,044,349 A | * | 9/1991 | Benedikt et al. ............. | 123/655 |
| 5,290,724 A | * | 3/1994 | Leach ......................... | 438/234 |
| 5,416,351 A | * | 5/1995 | Ito et al. ...................... | 257/357 |
| 5,671,111 A | * | 9/1997 | Chen ........................... | 361/56 |
| 5,675,169 A | * | 10/1997 | Hoshi et al. ................. | 257/355 |
| 5,874,763 A | * | 2/1999 | Ham ............................ | 257/360 |
| 5,962,979 A | * | 10/1999 | Dejonge ...................... | 315/71 |
| 6,188,263 B1 | * | 2/2001 | Uenishi ....................... | 327/313 |
| 6,222,235 B1 | * | 4/2001 | Kojima et al. ............... | 257/355 |
| 6,404,574 B1 | * | 6/2002 | Barnett ........................ | 360/46 |
| 6,455,902 B1 | * | 9/2002 | Voldman ..................... | 257/378 |
| 6,580,592 B2 | | 6/2003 | Kato | |
| 7,019,991 B2 | * | 3/2006 | Yamashita ................... | 363/52 |
| 7,279,757 B1 | * | 10/2007 | Scott et al. .................. | 257/408 |
| 7,358,572 B2 | * | 4/2008 | Voldman ..................... | 257/360 |
| 7,414,821 B2 | * | 8/2008 | Takikawa et al. ............ | 361/119 |
| 7,616,415 B2 | * | 11/2009 | Moon et al. ................. | 361/56 |
| 2004/0027502 A1 | * | 2/2004 | Tanaka et al. ................ | 349/40 |

FOREIGN PATENT DOCUMENTS

| | | | | |
|---|---|---|---|---|
| JP | 56060460 A | * | 5/1981 | |
| JP | 2001-339044 A | | 12/2001 | |
| JP | 2002-141467 A | | 5/2002 | |
| JP | 2002216994 A | * | 8/2002 | |
| JP | 2005064106 A | * | 3/2005 | |
| JP | 09116110 | | 5/2007 | |
| JP | 2007227697 A | * | 9/2007 | |

* cited by examiner

Primary Examiner—Leonardo Andújar
Assistant Examiner—Teresa M Arroyo
(74) Attorney, Agent, or Firm—Ladas & Parry LLP

(57) ABSTRACT

A semiconductor device is disclosed. The semiconductor device includes an internal circuit having a high breakdown voltage transistor, and a first electrostatic protection circuit in which electrostatic protection elements are connected in series. The sum of the breakdown voltage values of the electrostatic protection elements in the first electrostatic protection circuit is almost equal to the breakdown voltage value of the high breakdown voltage transistor. The first electrostatic protection circuit is connected between an input/output terminal and a ground terminal of the semiconductor device to which terminals the internal circuit is connected.

5 Claims, 4 Drawing Sheets

SEMICONDUCTOR ELECTROSTATIC PROTECTION DEVICE

BACKGROUND OF THE INVENTION

1. Field of the Invention

The present invention relates to a semiconductor device which provides an internal circuit having a high breakdown voltage transistor and electrostatic protection elements for protecting the internal circuit.

2. Description of the Related Art

Conventionally, there is a semiconductor device which provides an internal circuit having a high breakdown voltage transistor and electrostatic protection elements for protecting the internal circuit.

FIG. 3 is a diagram showing an equivalent circuit of a conventional semiconductor device 100.

As shown in FIG. 3, the conventional semiconductor device 100 provides an input/output terminal 101, a power source terminal 102, a ground terminal 103, a resistor 104, an internal circuit 106, and electrostatic protection elements 107 and 108.

The internal circuit 106 includes a high breakdown voltage transistor 109. The internal circuit 106 is electrically connected to the input/output terminal 101 via the resistor 104. In addition, the internal circuit 106 is electrically connected to the power source terminal 102 and the ground terminal 103.

The electrostatic protection element 107 is electrically connected to the input/output terminal 101 and the ground terminal 103 by being disposed inbetween. The electrostatic protection element 107 is a MOSFET type electrostatic protection element. The electrostatic protection element 107 has a breakdown voltage value which is almost equal to a breakdown voltage value of the high breakdown voltage transistor 109. When a surge voltage (abnormal voltage) such as static electricity is input to the input/output terminal 101, the electrostatic protection element 107 protects the internal circuit 106 from being damaged by a surge current caused by the surge voltage.

The electrostatic protection element 108 is electrically connected to the power source terminal 102 and the ground terminal 103 by being disposed inbetween. The electrostatic protection element 108 is a MOSFET type electrostatic protection element. The electrostatic protection element 108 has a breakdown voltage value which is almost equal to the value breakdown voltage of the high breakdown voltage transistor 109. The electrostatic protection element 108 has a structure similar to the structure of the electrostatic protection element 107. The electrostatic protection element 108 protects the line between the power source terminal 102 and the ground terminal 103 from being damaged by a surge voltage.

FIG. 4 is a cut-away side view of the semiconductor device 100 shown in FIG. 3 at a part where the electrostatic protection element 107 is shown.

As shown in FIG. 4, the electrostatic protection element 107 is formed on a P type semiconductor substrate 111. The electrostatic protection element 107 provides low concentration N type diffusion layers 113-1 and 113-2, source regions 114, a drain region 115, back gate power supply regions 116, a LOCOS oxide film 118, gate oxide films 119, gates 121, an insulation film 122, and electrodes 124 through 126.

The plural low concentration N type diffusion layers 113-1 and 113-2 are formed on the P type semiconductor substrate 111. The impurity concentration of the low concentration N type diffusion layers 113-1 and 113-2 is lower than that of the source regions 114 and the drain region 115.

The source regions 114 are formed on the low concentration N type diffusion layer 113-1. The drain region 115 is formed on the low concentration N type diffusion layer 113-2. The drain region 115 is formed between the source regions 114. The back gate power supply regions 116 are formed adjacent to the corresponding source regions 114 on the P type semiconductor substrate 111.

The LOCOS oxide film 118 is formed on the P type semiconductor substrate 111, the source regions 114, the drain region 115, and the back gate power supply regions 116. The gate oxide film 119 is formed on the P type semiconductor substrate 111. The gate 121 is formed on the gate oxide film 119 and the LOCOS oxide film 118 adjacent to the gate oxide film 119.

The insulation film 122 is formed to cover the LOCOS oxide film 118 and the gates 121. The insulation film 122 provides holes 122A for exposing the source regions 114 and the back gate power supply regions 116, holes 122B for exposing the gates 121, and a hole 122C for exposing the drain region 115.

The electrodes 124 are formed in the corresponding holes 122A. One end of each of the electrodes 124 is connected to the corresponding source region 114 and the back gate power supply region 116 and the other end of each of the electrodes 124 is connected to the ground terminal 103. The electrodes 125 are formed in the corresponding holes 122B. One end of each of the electrodes 125 is connected to the corresponding gate 121 and the other end of each of the electrodes 125 is connected to the ground terminal 103. The electrode 126 is formed in the hole 122C. One end of the electrode 126 is connected to the drain region 115 and the other end is connected to the input/output terminal 101 (for example, refer to Patent Document 1).

[Patent Document 1] Japanese Laid-Open Patent Application No. 9-116100

However, in the electrostatic protection elements 107 and 108, in order to prevent destruction of a PN junction E which is formed at a boundary between the low concentration N type diffusion layer 113-2 and the P type semiconductor substrate 111, the area of the PN junction E must be large. With this, the sizes of the electrostatic protection elements 107 and 108 become large, and the semiconductor device 100 cannot be small.

SUMMARY OF THE INVENTION

The present invention provides a small-sized semiconductor device which includes an internal circuit having a high breakdown voltage transistor and electrostatic protection elements for protecting the internal circuit.

According to one aspect of the present invention, there is provided a semiconductor device which includes an internal circuit having a high breakdown voltage transistor and electrostatic protection elements for protecting the internal circuit. The semiconductor device includes a first electrostatic protection circuit having plural electrostatic protection elements. The sum of breakdown voltage values of the plural electrostatic protection elements in the first electrostatic protection circuit is substantially equal to the breakdown voltage value of the high breakdown voltage transistor, the plural electrostatic protection elements are connected in series in the first electrostatic protection circuit and the first electrostatic protection circuit is connected between an input/output terminal and a ground terminal of the semiconductor device to which terminals the internal circuit is connected, and the electrostatic protection element includes a second conductive type diffusion layer formed substantially all over on a first conductive type semiconductor substrate.

According to an embodiment of the present invention, the plural electrostatic protection elements are formed on the first conductive type semiconductor substrate in series between the input/output terminal and the ground terminal where the internal circuit is electrically connected inbetween. In the conventional semiconductor device, the area of the PN junction E, which is formed at the boundary between the low concentration N type diffusion layer and the P type semiconductor substrate, must be large. However, in the embodiment of the present invention, the low concentration second conductive type diffusion layer is formed on the first conductive type semiconductor substrate substantially all over. Therefore, the area formed between the low concentration second conductive type diffusion layer and the first conductive type semiconductor substrate is sufficiently large. Therefore, the area occupied by the first conductive type semiconductor substrate and the plural electrostatic protection elements is smaller than the area occupied by the conventional semiconductor device, so that the area of the first electrostatic protection circuit can be small. Consequently, a small-sized semiconductor device can be obtained.

Other advantages and further features of the present invention will become apparent from the following detailed description when read in conjunction with the accompanying drawings.

DETAILED DESCRIPTION OF THE PREFERRED EMBODIMENT

Figure 1:
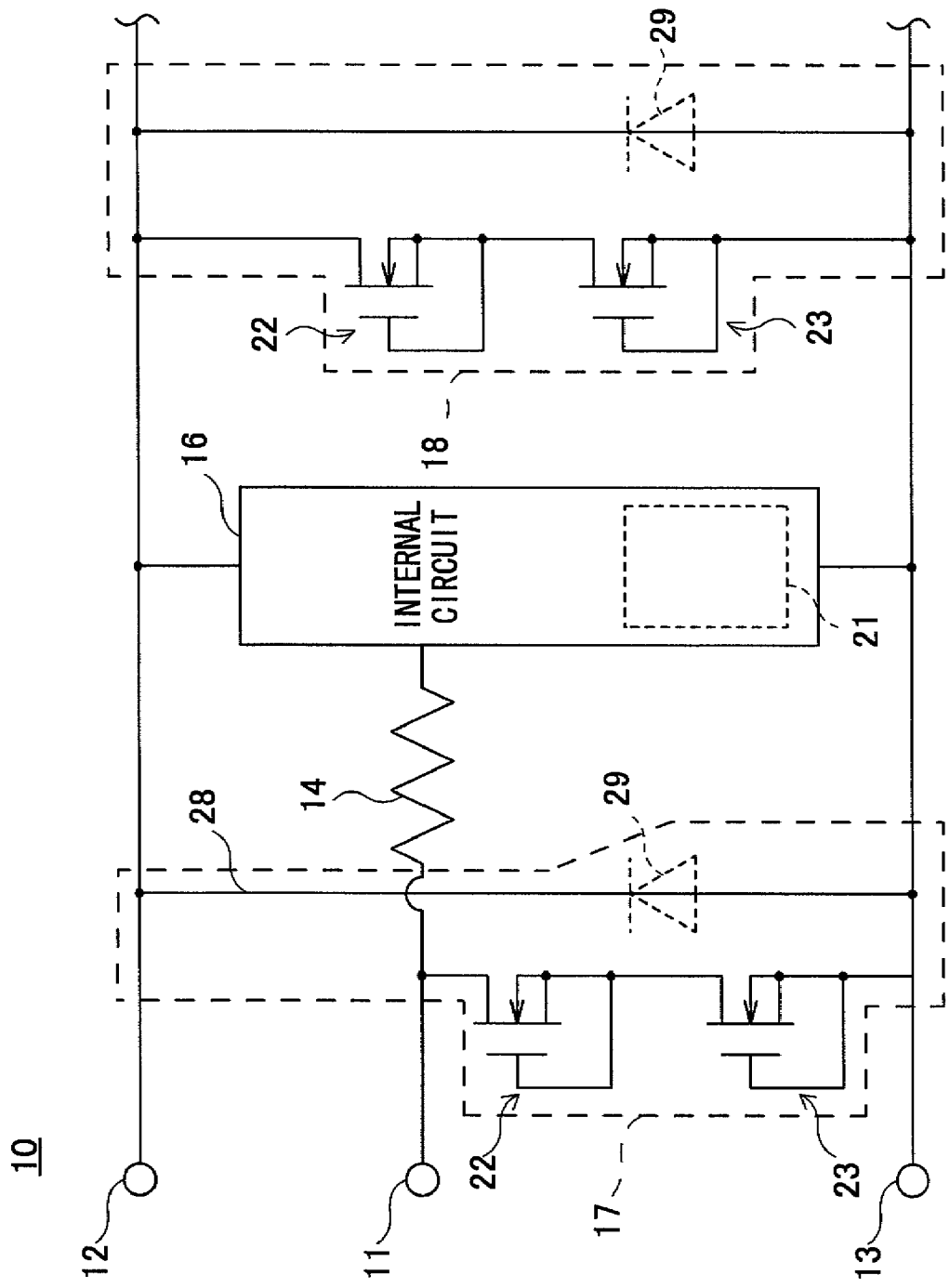
FIG. 1 is a circuit diagram showing a semiconductor device according to an embodiment of the present invention.

Referring now to the drawings, an embodiment of the present invention is described.

Embodiment

FIG. 1 is a circuit diagram showing a semiconductor device according to an embodiment of the present invention.

As shown in FIG. 1, a semiconductor device 10 according to the embodiment of the present invention includes an input/output terminal 11, a power source terminal 12, a ground terminal 13, a resistor 14, an internal circuit 16, a first electrostatic protection circuit 17, and a second electrostatic protection circuit 18.

A signal is input/output to/from the input/output terminal 11. The input/output terminal 11 is electrically connected to the internal circuit 16 via the resistor 14. Power source electric potential is supplied from the power source terminal 12 and is electrically connected to the internal circuit 16.

The ground terminal 13 having ground potential is electrically connected to the internal circuit 16.

The resistor 14 is electrically connected to the input/output terminal 11 and the internal circuit 16. The resistor 14 prevents a surge current from being input to the internal circuit 16 when a surge voltage is input to the input/output terminal 11.

The internal circuit 16 includes a high breakdown voltage transistor 21. The internal circuit 16 is electrically connected to the input/output terminal 11 via the resistor 14. In addition, the internal circuit 16 is electrically connected to the power source terminal 12 and the ground terminal 13.

Figure 2:
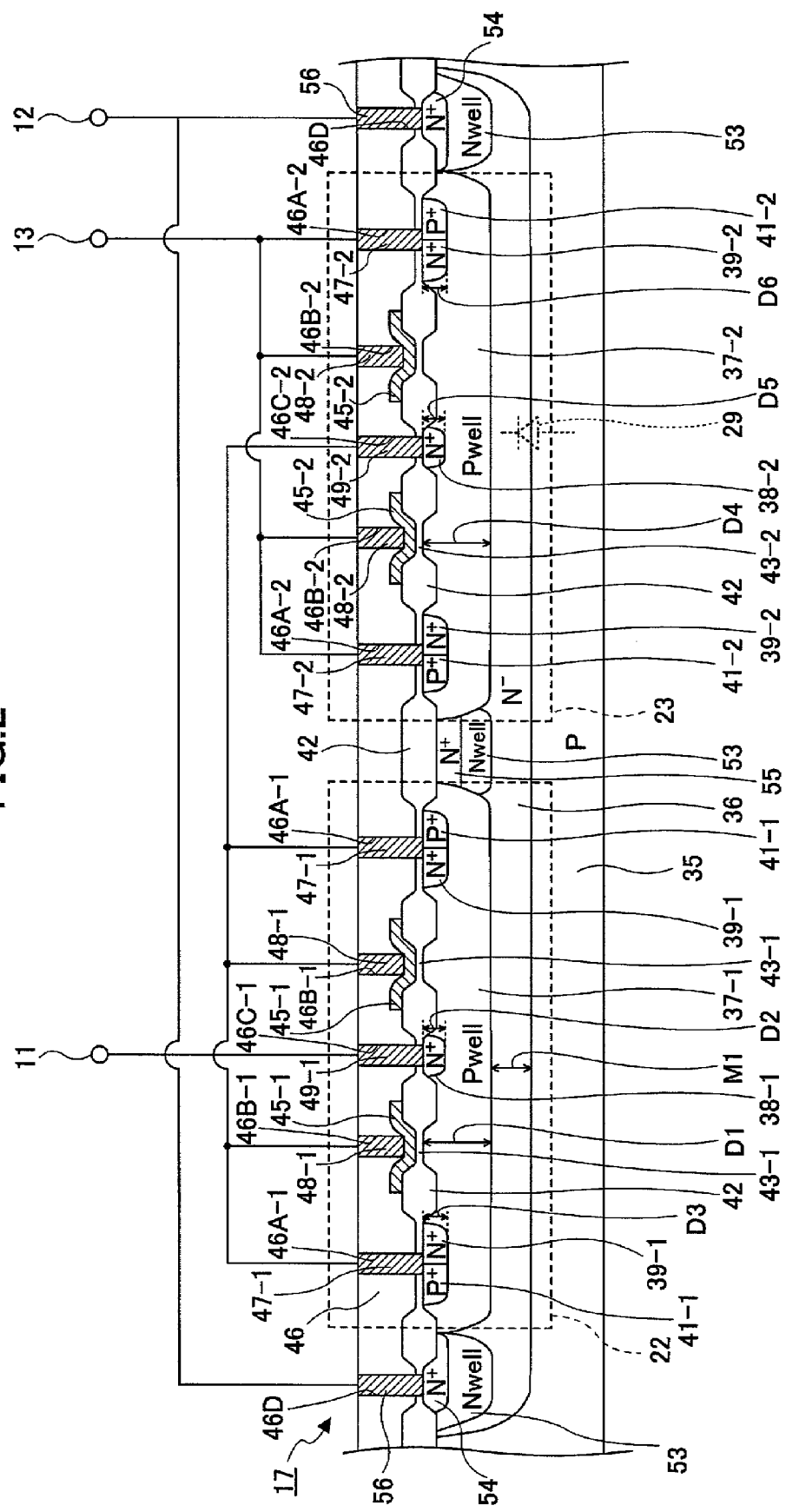
FIG. 2 is a cut-away side view of the semiconductor device shown in FIG. 1 at a part where a first electrostatic protection circuit is shown.

FIG. 2 is a cut-away side view of the semiconductor device 10 shown in FIG. 1 at a part where the first electrostatic protection circuit 17 is shown.

In the embodiment of the present invention, a P type is called a first conductive type, and an N type is called a second conductive type. In addition, in electrostatic protection elements 22 and 23 (described below), each element in the electrostatic protection element 22 has a suffix "-1", and each element in the electrostatic protection element 23 has a suffix "-2". However, each of common elements in the electrostatic protection elements 22 and 23 such as a low concentration N type diffusion layer 36, a LOCOS oxide film 42, and an insulation film 46 does not have the suffix.

As shown in FIG. 2, the first electrostatic protection circuit 17 is formed on a P type semiconductor substrate 35 (the first conductive type). The first electrostatic protection circuit 17 includes the electrostatic protection elements 22 and 23, N well layers 53, power supply contact layers 54, a channel stopper layer 55, and an electrode 56.

The electrostatic protection element 22 includes the low concentration N type diffusion layer 36 (the second conductive type), a P well layer 37-1 (the first conductive type), a drain region 38-1 (the second conductive type), source regions 39-1 (the second conductive type), back gate power supply regions 41-1 (the first conductive type), the LOCOS oxide film 42, gate oxide films 43-1, gates 45-1, the insulation film 46, and electrodes 47-1, 48-1, and 49-1.

The low concentration N type diffusion layer 36 is formed on the P type semiconductor substrate 35 at the positions where the electrostatic protection elements 22 and 23 are formed and the positions adjacent to the electrostatic protection elements 22 and 23. The impurity concentration of the low concentration N type diffusion layer 36 is lower than the impurity concentration contained in the drain region 38-1 and the source regions 39-1. The thickness M1 of the low concentration N type diffusion layer 36 between the P well layer 37-1 and the P type semiconductor substrate 35 can be, for example, 2 µm. In addition, when the N type impurity concentration of the drain region 38-1 and the source regions 39-1 is $1.0 \times 10^{18}$ cm$^{-3}$ the N type impurity concentration of the low concentration N type diffusion layer 36 can be, for example, $1.0 \times 10^{15}$ cm$^3$.

The P well layer 37-1 is formed on the low concentration N type diffusion layer 36 at a position where the electrostatic protection element 22 is formed. The P well layer 37-1 is formed by diffusing P type impurities in the low concentration N type diffusion layer 36. The depth D1 of the P well layer 37-1 can be, for example, 1 µm to 10 µm, when the lower surface of the gate oxide film 43-1 is the reference level.

The drain region 38-1 is formed on the P well layer 37-1 at a position near the center thereof. The drain region 38-1 is formed by diffusing N type impurities in the P well layer 37-1. As described above, the N type impurity concentration of the drain region 38-1 can be, for example, $1.0 \times 10^{18}$ cm$^{-3}$. The depth D2 of the drain region 38-1 can be, for example, 0.1 µm to 0.5 µm.

The source regions 39-1 are formed on the P well layer 37-1 with the drain region 38-1 inbetween. The source regions 39-1 are formed by diffusing N type impurities in the P well layer 37-1. As described above, the N type impurity concentration of the source regions 391 can be, for example, $1.0 \times 10^{18}$ cm$^{-3}$. The depth D3 of the source region 39-1 can be, for example, 0.1 µm to 0.5 µm.

The back gate power supply regions 41-1 are formed on the P well layer 37-1 adjacent to the corresponding source regions 39-1. The back gate power supply regions 41-1 are formed by diffusing P type impurities in the P well layer 37-1.

The LOCOS oxide film 42 is formed on the P well layer 37-1, the drain region 38-1, the source regions 39-1, and the back gate power supply regions 41-1 so that parts of the drain region 38-1, the source regions 39-1, and the back gate power supply regions 41-1 are exposed. The gate oxide film 43-1 is formed on the P well layer 37-1 surrounded by the LOCOS oxide film 42.

The gate 45-1 is formed on the gate oxide film 43-1 and a part of the LOCOS oxide film 42 which part surrounds the gate oxide film 43-1.

The insulation film 46 is formed to cover the LOCOS oxide film 42 and the gates 45-1 formed in the forming region of the electrostatic protection element 22, to cover the LOCOS oxide film 42 and gates 45-2 formed in the forming region of the electrostatic protection element 23, and to cover the LOCOS oxide film 42 formed outside the forming regions of the electrostatic protection elements 22 and 23. In the insulation film 46 formed in the forming region of the electrostatic protection element 22, holes 46A-1 for exposing the source regions 39-1 and the back gate power supply regions 41-1, holes 46B-1 for exposing the gates 45-1, and a hole 46C-1 for exposing the drain region 38-1 are formed. In addition, in the insulation film 46 positioned outside the forming regions of the electrostatic protection elements 22 and 23, holes 46D for exposing the power supply contact layers 54 are formed.

The electrodes 47-1 are formed in the corresponding holes 46A-1. One end of each of the electrodes 47-1 is connected to the source region 39-1 and the back gate power supply region 41-1, and the other end of each of the electrodes 47-1 is connected to the electrodes 48-1 and an electrode 49-2 formed in the electrostatic protection element 23.

The electrodes 48-1 are formed in the corresponding holes 46B-1. One end of each of the electrodes 48-1 is connected to the corresponding gate 45-1, and the other end of each of the electrodes 48-1 is connected to the electrodes 47-1 and the electrode 49-2 formed in the electrostatic protection element 23.

The electrode 49-1 is formed in the hole 46C-1. One end of the electrode 49-1 is connected to the drain region 38-1, and the other end of the electrode 49-1 is connected to the input/output terminal 11.

The electrostatic protection element 23 includes the low concentration N type diffusion layer 36, a P well layer 37-2 (the first conductive type), a drain region 38-2 (the second conductive type), source regions 39-2 (the second conductive type), back gate power supply regions 41-2 (the first conductive type), the LOCOS oxide film 42, gate oxide films 43-2, gates 45-2, the insulation film 46, and electrodes 47-2, 48-2, and 49-2.

The P well layer 37-2 is formed on the low concentration N type diffusion layer 36 in a region where the electrostatic protection element 23 is formed. The P well layer 37-2 is connected to the ground terminal 13 via the back gate power supply region 41-2 and the electrode 47-2. Therefore, the potential of the P well layer 37-2 is ground potential. The P well layer 37-2 is formed by diffusing P type impurities in the low concentration N type diffusion layer 36. The depth D4 of the P well layer 37-2 can be, for example, 1 µm to 10 µm, when the lower surface of the gate oxide film 43-2 is the reference level.

The drain region 38-2 is formed at a position near the center on the P well layer 372. The drain region 38-2 is connected to the source regions 39-1, the back gate power supply regions 41-1, and the gates 45-1 formed in the electrostatic protection element 22 via the electrode 49-2. The drain region 38-2 is formed by diffusing N type impurities in the P well layer 37-2. The N type impurity concentration of the drain region 38-2 can be, for example, $1.0 \times 10^{18}$ cm$^{-3}$. The depth D5 of the drain region 38-2 can be, for example, 0.1 µm to 0.5 µm.

The source regions 39-2 are formed on the P well layer 37-2 with the drain region 38-2 inbetween. The source region 39-2 is connected to the ground terminal 13 via the electrode 47-2. Therefore, the potential of the source region 39-2 is ground potential. The source regions 39-2 are formed by diffusing N type impurities in the P well layer 37-2. The N type impurity concentration of the source regions 39-2 can be, for example, $1.0 \times 10^{18}$ cm$^{-3}$. The depth D6 of the source region 39-2 can be, for example, 0.1 µm to 0.5 µm.

The back gate power supply regions 41-2 are formed on the P well layer 37-2 adjacent to the corresponding source regions 39-2. The back gate power supply regions 41-2 are formed by diffusing P type impurities in the P well layer 37-2.

The LOCOS oxide film 42 is formed on the P well layer 37-2, the drain region 38-2, the source regions 39-2, and the back gate power supply regions 41-2 so that parts of the drain region 38-2, the source regions 39-2, and the back gate power supply regions 41-2 are exposed.

The gate oxide film 43-2 is formed on the P well layer 37-2 by surrounded by the LOCOS oxide film 42.

The gate 45-2 is formed on the gate oxide film 43-2 and a part of the LOCOS oxide film 42 which part surrounds the gate oxide film 43-2.

In the insulation film 46 formed in the forming region of the electrostatic protection element 23, holes 46A-2 for exposing the source regions 39-2 and the back gate power supply regions 41-2, holes 46B-2 for exposing the gates 45-2, and a hole 46C-2 for exposing the drain region 38-2 are formed.

The electrodes 47-2 are formed in the corresponding holes 46A-2. One end of each of the electrodes 47-2 is connected to the corresponding source region 39-2 and the back gate power supply region 41-1 and the other end of each of the electrodes 47-2 is connected to the ground terminal 13.

The electrodes 48-2 are formed in the corresponding holes 46B-2. One end of each of the electrodes 48-2 is connected to the corresponding gate 45-2, and the other end of each of the electrodes 48-2 is connected to the ground terminal 13.

The electrode 49-2 is formed in the hole 46C-2. One end of the electrode 49-2 is connected to the drain region 38-2 and the other end of the electrode 49-2 is connected to the electrodes 47-1 and 48-1 formed in the electrostatic protection element 22.

The electrostatic protection elements 22 and 23 are MOSFET type electrostatic protection elements (specifically, N channel type). As shown in FIG. 1, the electrostatic protection elements 22 and 23 in the first electrostatic protection circuit 17 are connected in series between the input/output terminal 11 and the ground terminal 13. When a surge voltage (abnormal voltage) such as static electricity is input to the input/output terminal 11, the electrostatic protection elements 22 and 23 in the first electrostatic protection circuit 17 protect the internal circuit 16 from being damaged by a surge current caused by the surge voltage. The sum of the breakdown voltage values of the electrostatic protection elements 22 and 23 is substantially equal to the breakdown voltage value of the high breakdown voltage transistor 21 in the internal circuit 16.

In a case where the resistor 14 is provided between the input/output terminal 11 and the internal circuit 16, the sum of the breakdown voltage values of the electrostatic protection elements 22 and 23 can be slightly greater than the breakdown voltage value of the high breakdown voltage transistor 21. In this case, since a surge current hardly flows into the internal circuit 16 via the resistor 14, the surge current mainly flows into the electrostatic protection elements 22 and 23, and the internal circuit 16 can be protected from being damaged.

When the resistor 14 is not provided between the input/output terminal 11 and the internal circuit 16, the sum of the breakdown voltage values of the electrostatic protection elements 22 and 23 is preferably smaller than the breakdown voltage value of the high breakdown voltage transistor 21. Specifically, the sum of the breakdown voltage values of the electrostatic protection elements 22 and 23 is greater than a specification voltage guaranteed in a product and smaller than the breakdown voltage value of the high breakdown voltage transistor 21. In this case, since the surge current flows into the electrostatic protection elements 22 and 23, the electrostatic protection elements 22 and 23 are damaged without damaging the internal circuit 16.

Figure 3:
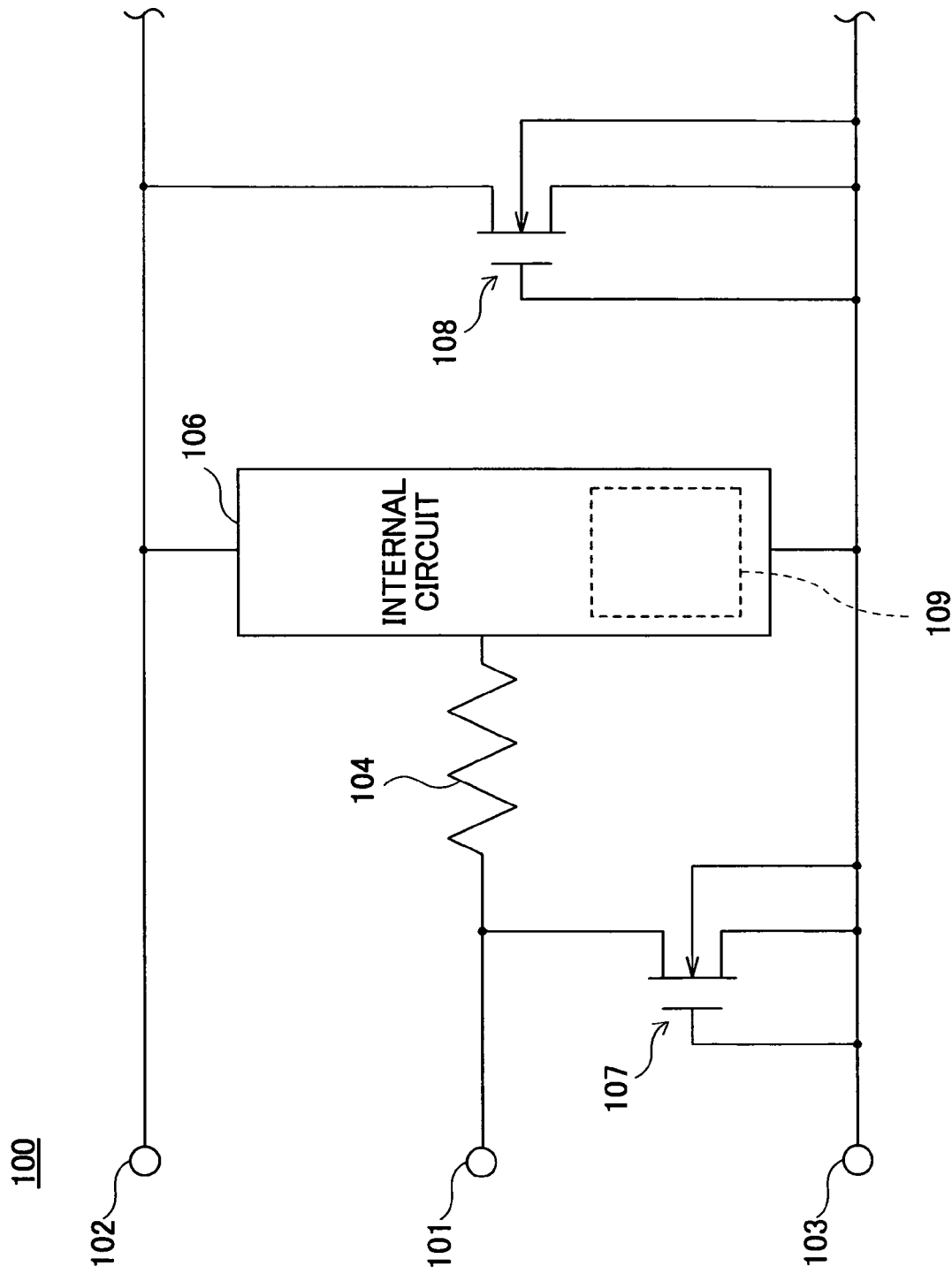
FIG. 3 is a diagram showing an equivalent circuit of a conventional semiconductor device.
Figure 4:
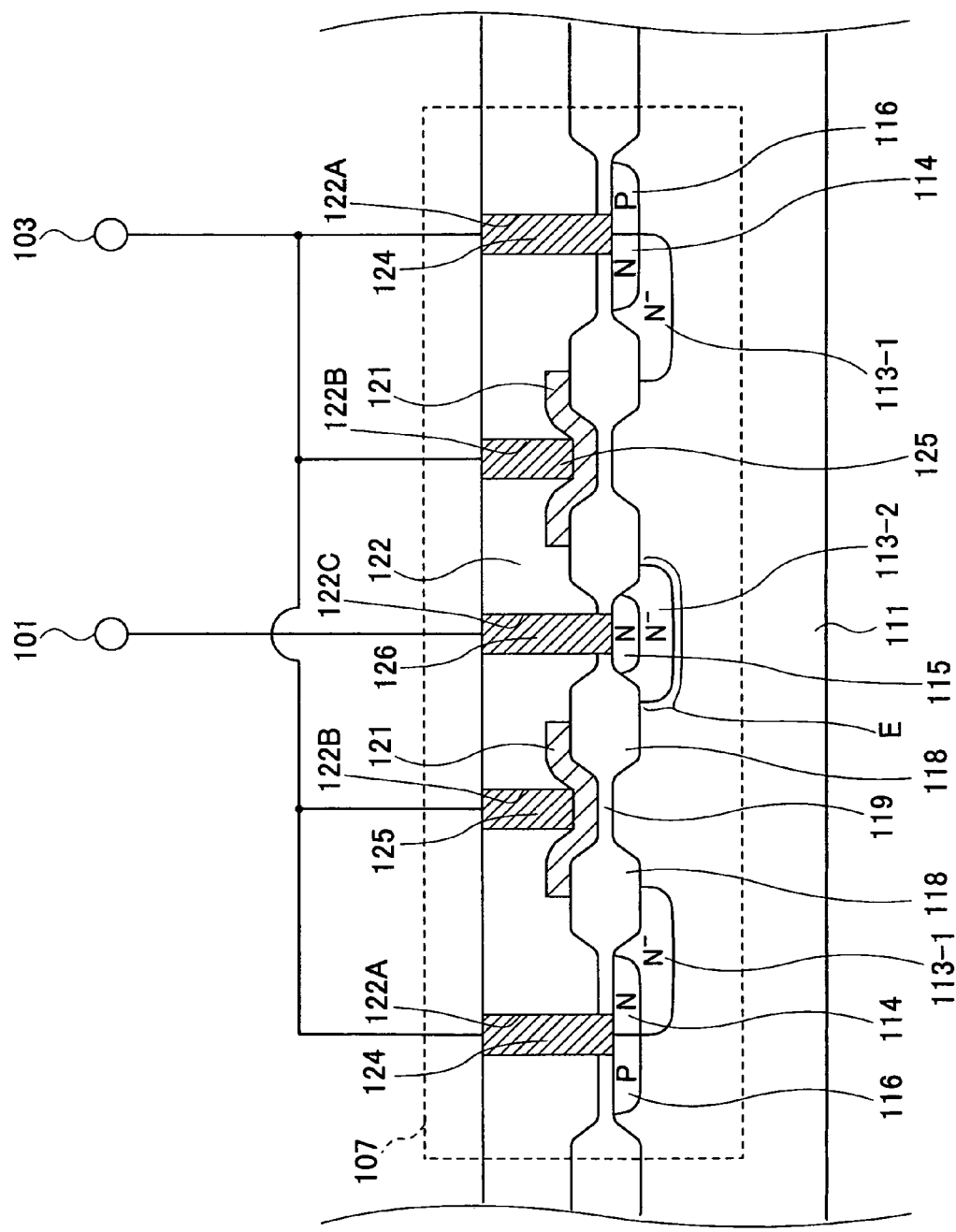
FIG. 4 is a cut-away side view of the semiconductor device shown in FIG. 3 at a part where an electrostatic protection element is shown.

As described above, in the present embodiment, in the semiconductor device 10, the electrostatic protection elements 22 and 23 are provided, the sum of the breakdown voltage values of the electrostatic protection elements 22 and 23 is substantially equal to the breakdown voltage value of the high breakdown voltage transistor 21, and the electrostatic protection elements 22 and 23 are connected in series between the input/output terminal 11 and the ground terminal 13. In the conventional semiconductor device 100, the area of the PN junction E, which is formed at the boundary between the low concentration N type diffusion layer 113-2 and the P type semiconductor substrate 111, must be large. However, in the present embodiment, the low concentration N type diffusion layer 36 is formed on the P type semiconductor substrate 35 substantially all over. Therefore, the area between the low concentration N type diffusion layer 36 and the P type semiconductor substrate 35 is sufficiently large. When the semiconductor device 10 is compared with the conventional semiconductor device 100 shown in FIGS. 3 and 4, the area occupied by the electrostatic protection elements 22 and 23 in the P type semiconductor substrate 35 is smaller than the area occupied by the electrostatic protection element 107 whose breakdown voltage value is substantially equal to the breakdown voltage value of the high breakdown voltage transistor 109 in the P type semiconductor substrate 111. Therefore, the first electrostatic protection circuit 17 can be small-sized. Consequently, the semiconductor device 10 can be small-sized.

In addition, when MOSFET type electrostatic protection elements are used as the electrostatic protection elements 22 and 23, the semiconductor device 10 can be smaller-sized than in a case where diode type electrostatic protection elements are used. Even if the diode type electrostatic protection elements are used as the electrostatic protection elements 22 and 23, the semiconductor device 10 can be small-sized.

In addition, since the low concentration N type diffusion layer 36 is formed between the P type semiconductor substrate 35 of ground potential and the P well layers 37-1 and 37-2, the back gate power supply regions 41-1 and 41-2 are not electrically connected. Therefore, a short circuit does not occur between the back gate power supply regions 41-1 and 41-2.

The N well layers 53 are formed on the low concentration N type diffusion layer 36 to surround the P well layers 37-1 and 37-2. The N well layers 53 are formed by diffusing N type impurities in the low concentration N type diffusion layer 36.

The power supply contact layers 54 are formed on the corresponding N well layers 53 disposed on the outer rim part of the low concentration N type diffusion layer 36. The power supply contact layer 54 is formed by diffusing N type impurities in the N well layer 53. The power supply contact layer 54 is connected to the power source terminal 12 via the electrode 56. Therefore, the potential of the low concentration N type diffusion layer 36 is the power source potential.

The channel stopper layer 55 is formed on the N well layer 53 disposed right under the LOCOS oxide film 42 positioned between the electrostatic protection elements 22 and 23. The channel stopper layer 55 is formed by diffusing N type impurities in the N well layer 53. The channel stopper layer 55 prevents field inversion.

The electrodes 56 are formed in the corresponding holes 46D formed in the insulation film 46. One end of each of the electrodes 56 is connected to the power supply contact layer 54 and the other end of each of the electrodes 56 is connected to the power source terminal 12.

Since the depth of the low concentration N type diffusion layer 36 is sufficiently deep such as 2 μm, and a parasitic diode 29 is formed between the P type semiconductor substrate 35 of ground potential and the low concentration N type diffusion layer 36 connected to the power source terminal 12, a force against ESD (electrostatic discharge) of the first electrostatic protection circuit 17 can be increased.

The second electrostatic protection circuit 18 has the same structure as that of the first electrostatic protection circuit 17. That is, the second electrostatic protection circuit 18 includes the electrostatic protection elements 22 and 23 connected in series, and is connected between the power source terminal 12 and the ground terminal 13. The second electrostatic protection circuit 18 protects the line between the power source terminal 12 and the ground terminal 13.

As described above, in the present embodiment, in the second electrostatic protection circuit 18 of the semiconductor device 10, the electrostatic protection elements 22 and 23 are connected in series between the power source terminal 12 and the ground terminal 13. When the semiconductor device 10 is compared with the conventional semiconductor device 100 shown in FIGS. 3 and 4, the area occupied by the electrostatic protection elements 22 and 23 in the P type semiconductor substrate 35 is smaller than the area occupied by the electrostatic protection element 108 whose breakdown voltage value is substantially equal to the breakdown voltage value of the high breakdown voltage transistor 109 in the P type semiconductor substrate 111. Therefore, the second electrostatic protection circuit 18 can be small-sized. Consequently, the semiconductor device 10 can be small-sized.

Since the parasitic diode 29 is formed between the P type semiconductor substrate 35 of ground potential and the low concentration N type diffusion layer 36 connected to the power source terminal 12, a force against ESD of the second electrostatic protection circuit 18 can be increased.

According to the semiconductor device 10 in the embodiment of the present invention, the sum of the breakdown voltage values of the electrostatic protection elements 22 and 23 is substantially equal to the breakdown voltage value of the high breakdown voltage transistor 21, and the electrostatic protection elements 22 and 23 are connected in series between the input/output terminal 11 and the ground terminal 13 in the first electrostatic protection circuit 17. In the conventional semiconductor device 100, the area of the PN junction E, which is formed at the boundary between the low concentration N type diffusion layer 113-2 and the P type semiconductor substrate 111, must be large. However, in the present embodiment, the low concentration N type diffusion layer 36 is formed on the P type semiconductor substrate 35 substantially all over. Therefore, the area between the low concentration N type diffusion layer 36 and the P type semiconductor substrate 35 is sufficiently large. When the semiconductor device 10 is compared with the conventional semiconductor device 100 shown in FIGS. 3 and 4, the area occupied by the electrostatic protection elements 22 and 23 in the P type semiconductor substrate 35 is smaller than the area occupied by the electrostatic protection element 107 whose breakdown voltage value is substantially equal to the breakdown voltage value of the high breakdown voltage transistor 109 in the P type semiconductor substrate 111. Therefore, the first electrostatic protection circuit 17 can be small-sized. Consequently, the semiconductor device 10 can be small-sized.

In addition, when the first and second electrostatic protection circuits 17 and 18 are connected to corresponding plural terminals (not shown) formed in the semiconductor device 10, a force against ESD between the power source terminal 12 and the ground terminal 13 can be further increased.

In the present embodiment, two electrostatic protection elements (the electrostatic protection elements 22 and 23) are provided in each of the electrostatic protection circuits 17 and 18. However, three or more electrostatic protection elements can be provided in each of the electrostatic protection circuits 17 and 18. In his case, the three or more electrostatic protection elements are connected in series between the input/output terminal 11 and the ground terminal 13, and the three or more electrostatic protection elements are connected in series between the power source terminal 12 and the ground terminal 13.

In addition, in the present embodiment, the semiconductor device 10 includes the electrostatic protection elements 22 and 23 of the N channel type MOSFET. However, a P channel type MOSFET can be used as each of the electrostatic protection elements 22 and 23. In this case (the N type is the first conductive type, and the P type is the second conductive type), a similar effect to that in the present embodiment can be obtained.

Further, the present invention is not limited to the embodiment, but variations and modifications may be made without departing from the scope of the present invention.

The present application is based on Japanese Priority Patent Application No. 2006-180227 filed on Jun. 29, 2006, with the Japanese Patent Office, the entire contents of which are hereby incorporated herein by reference.

What is claimed is:

1. A semiconductor electrostatic protection device which provides an internal circuit having a high breakdown voltage transistor and electrostatic protection elements for protecting the internal circuit, comprising:
    a first electrostatic protection circuit including a plurality of the electrostatic protection elements;
    an input/output terminal;
    a ground terminal; and
    a power source terminal; wherein
    a sum of breakdown voltage values of the plurality of electrostatic protection elements in the first electrostatic protection circuit is substantially equal to the breakdown voltage value of the high breakdown voltage transistor;
    the plurality of the electrostatic protection elements are connected in series in the first electrostatic protection circuit and the first electrostatic protection circuit is connected between the input/output terminal and the ground terminal to which terminals the internal circuit is connected; and
    the electrostatic protection element includes a second conductive type diffusion layer formed substantially all over on a first conductive type semiconductor substrate,
    wherein the electrostatic protection element is a MOSFET type electrostatic protection element and the MOSFET type electrostatic protection element includes:
        a first conductive type well layer formed on a first conductive type semiconductor substrate;
        second conductive type source regions formed on the first conductive type well layer;
        a second conductive type drain region formed on the first conductive type well layer;
        first conductive type back gate power supply regions formed on the first conductive type well layer; and
        a second conductive type diffusion layer for electrically separating the first conductive type semiconductor substrate from the first conductive type well layer formed on the first conductive type semiconductor substrate; wherein
            an impurity concentration of the second conductive type diffusion layer is less than an impurity concentration of the second conductive type source regions and the second conductive type drain region.

2. The semiconductor electrostatic protection device as claimed in claim 1, further comprising:
    a second electrostatic protection circuit including a plurality of the electrostatic protection elements; wherein
        the electrostatic protection elements are connected in series in the second electrostatic protection circuit between the power source terminal and the ground terminal to which terminals the internal circuit is connected.

3. The semiconductor electrostatic protection device as claimed in claim 1, wherein;
    potential of the first conductive type semiconductor substrate is ground potential and potential of the second conductive type diffusion layer is power source potential.

4. The semiconductor electrostatic protection device as claimed in claim 1, further comprising:
    a parasitic diode formed between the first conductive type semiconductor substrate and the second conductive type diffusion layer.

5. The semiconductor electrostatic protection device as claimed in claim 4, wherein;
    potential of the first conductive type semiconductor substrate is ground potential and potential of the second conductive type diffusion layer is power source potential.

* * * * *